US012599021B2

(12) United States Patent
Kumashikar et al.

(10) Patent No.: US 12,599,021 B2
(45) Date of Patent: Apr. 7, 2026

(54) HOMOGENOUS DIE STACKING WITH INCREASED ELEMENT DENSITY

(71) Applicant: Altera Corporation, San Jose, CA (US)

(72) Inventors: Mahesh K. Kumashikar, Bangalore (IN); Dheeraj Subbareddy, Portland, OR (US); Ankireddy Nalamalpu, Portland, OR (US); MD Altaf Hossain, Portland, OR (US); Atul Maheshwari, Portland, OR (US)

(73) Assignee: Altera Corporation, San Jose, CA (US)

( * ) Notice: Subject to any disclaimer, the term of this patent is extended or adjusted under 35 U.S.C. 154(b) by 970 days.

(21) Appl. No.: 17/484,922

(22) Filed: Sep. 24, 2021

(65) Prior Publication Data

US 2022/0013488 A1     Jan. 13, 2022

(51) Int. Cl.
  *H01L 23/00*       (2006.01)
  *H01L 23/48*       (2006.01)
  *H01L 25/00*       (2006.01)
  *H01L 25/065*      (2023.01)

(52) U.S. Cl.
  CPC ............ *H01L 24/16* (2013.01); *H01L 23/481* (2013.01); *H01L 24/81* (2013.01); *H01L 25/0657* (2013.01); *H01L 25/50* (2013.01); *H01L 2224/16146* (2013.01); *H01L 2225/06513* (2013.01)

(58) Field of Classification Search
  CPC ..... H01L 24/14; H01L 24/16; H01L 25/0657; H01L 25/50; H01L 2224/16146; H01L 2224/16145; H01L 2224/13025; H01L 2224/14181; H01L 2224/1403; H01L 2224/16225; H01L 2224/81801; H01L 2224/3101; H01L 2225/06513; H01L 2225/06527; H01L 2225/06541; H01L 2225/06562; H01L 2225/06565; H01L 2924/014; H01L 2924/00014; H01L 2924/1431; H01L 2924/1433; H01L 2924/1434; H01L 2924/10253; G06F 30/39

USPC ................................................. 257/738, 777
  See application file for complete search history.

(56) References Cited

U.S. PATENT DOCUMENTS

| | | | |
|---|---|---|---|
| 10,833,679 B2 | 11/2020 | Clark et al. | |
| 11,101,804 B2 * | 8/2021 | Weber | ................. H01L 25/0652 |
| 11,632,112 B2 * | 4/2023 | Gutala | .................... H01L 25/18 |
| | | | 711/103 |

(Continued)

*Primary Examiner* — Jasmine J Clark
(74) *Attorney, Agent, or Firm* — Fletcher Yoder, P.C.

(57) ABSTRACT

An integrated circuit device includes multiple microbumps and a top programmable fabric die including a first programmable fabric and a first microbump interface coupled to the multiple microbumps. The integrated circuit device also includes a base programmable fabric die having a second programmable fabric and a second microbump interface coupled to the first microbump interface via a coupling to the multiple microbumps. The top programmable fabric die and the base programmable fabric die have a same design. Moreover, the top programmable fabric die and the base programmable fabric die are arranged in a three-dimensional die arrangement with the top programmable fabric die flipped above the base programmable fabric die.

19 Claims, 5 Drawing Sheets

(56)                    References Cited

U.S. PATENT DOCUMENTS

| | | | |
|---|---|---|---|
| 2012/0162836 A1* | 6/2012 | Furuta | H01L 23/62 |
| | | | 327/427 |
| 2016/0049941 A1 | 2/2016 | How et al. | |

* cited by examiner

HOMOGENOUS DIE STACKING WITH INCREASED ELEMENT DENSITY

BACKGROUND

This disclosure relates to a die stacking of homogenous dies. Specifically, the homogenous dies are made using a same process and have a same form.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be noted that these statements are to be read in this light, and not as admissions of any kind.

Integrated circuits are found in numerous electronic devices, from handheld devices, computers, gaming systems, robotic devices, automobiles, and more. These integrated circuits are often disposed on silicon die or chips that communicate with each other. When multiple integrated circuits are included in a same package, the integrated circuits may use different processes and/or form factors. For instance, one of the integrated circuits (e.g., the base integrated circuit) may incorporate through silicon vias (TSVs) while the other integrated circuit does not incorporate tsvs causing the integrated circuits to have different layouts. Each different integrated circuit layout corresponds to different development cycles. Accordingly, incorporating different integrated circuits having different development cycles may increase the time and/or costs used to develop the package and bring the package to market.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "including" and "having" are intended to be inclusive and mean that there may be additional elements other than the listed elements. Additionally, it should be understood that references to "some embodiments," "embodiments," "one embodiment," or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B. Moreover, this disclosure describes various data structures, such as instructions for an instruction set architecture. These are described as having certain domains (e.g., fields) and corresponding numbers of bits. However, it should be understood that these domains and sizes in bits are meant as examples and are not intended to be exclusive. Indeed, the data structures (e.g., instructions) of this disclosure may take any suitable form.

Figure 1:
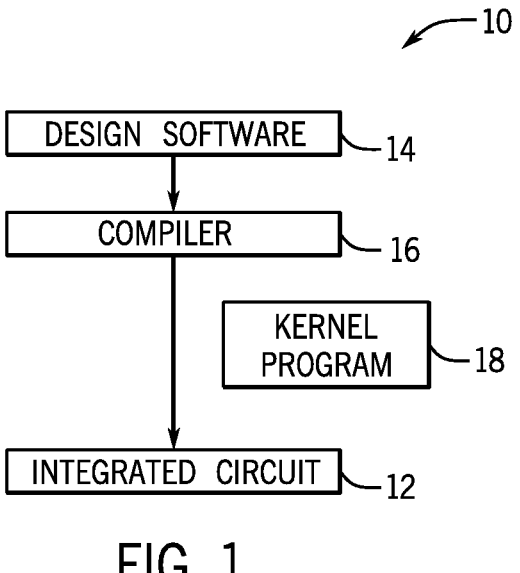
FIG. 1 is a block diagram of a process for programming an integrated circuit including a programmable fabric, in accordance with an embodiment.

An integrated circuit may utilize one or more programmable fabrics (e.g., FPGAs). With the foregoing in mind, FIG. 1 illustrates a block diagram of a system 10 used to configure a programmable device. A designer may implement functionality on an integrated circuit, such as an integrated circuit 12 that includes some reconfigurable circuitry, such as an FPGA. A designer may implement a circuit design to be programmed onto the integrated circuit 12 using design software 14, such as a version of Quartus by Altera™. The design software 14 may use a compiler 16 to generate a low-level circuit-design, which may be provided as a kernel program 18, sometimes known as a program object file or bitstream, that programs the integrated circuit 12. That is, the compiler 16 may provide machine-readable instructions representative of the circuit design to the integrated circuit 12.

Figure 2:
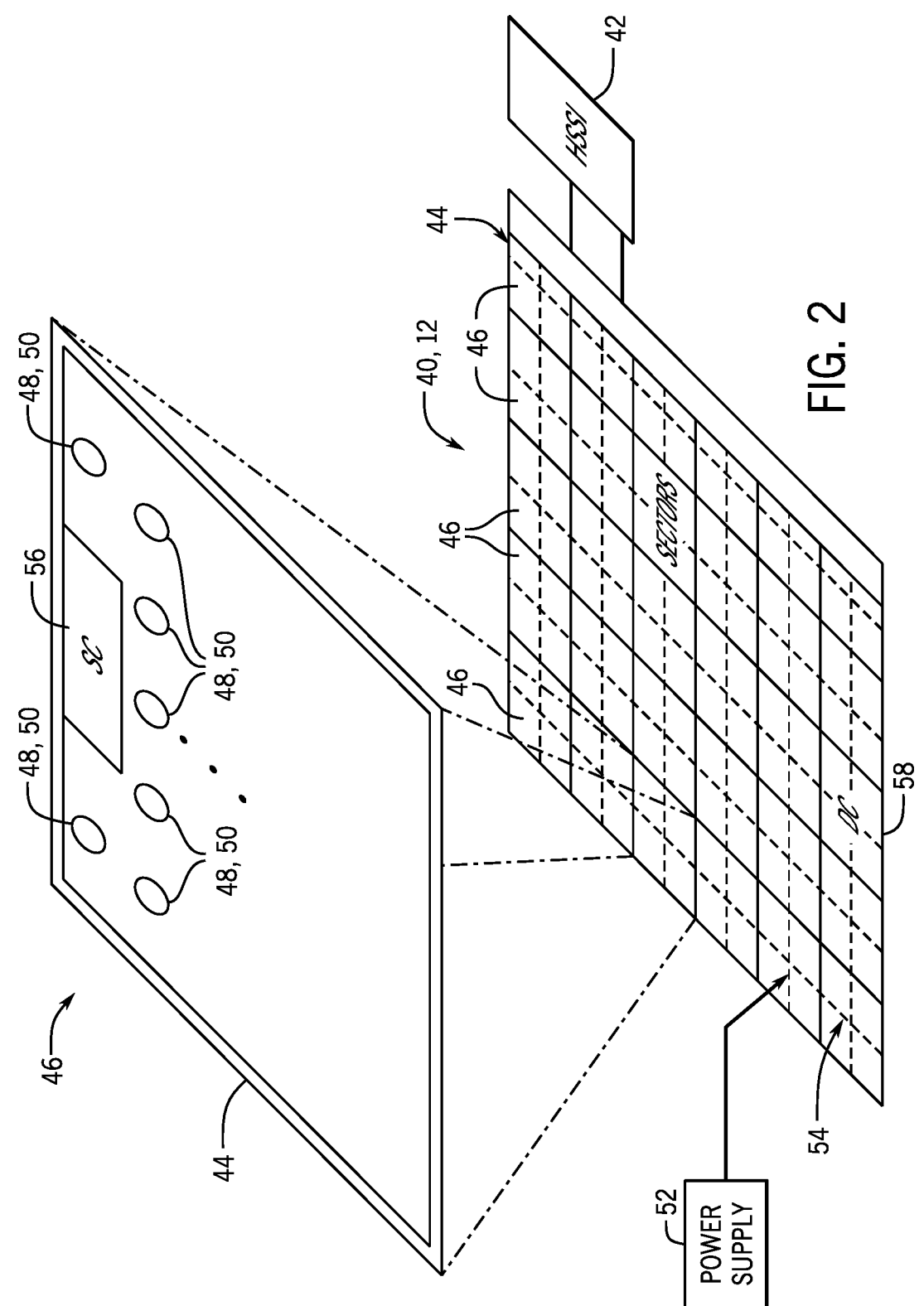
FIG. 2 is a diagram of the programmable fabric of FIG. 1, in accordance with an embodiment.

The integrated circuit 12 may include any programmable logic device, such as a field programmable gate array (FPGA) 40, as shown in FIG. 2. For the purposes of this example, the FPGA 40 is referred to as an FPGA, though it should be understood that the device may be any suitable type of programmable logic device (e.g., an application-specific integrated circuit and/or application-specific standard product). In one example, the FPGA 40 is a sectorized FPGA of the type described in U.S. Patent Publication No. 2016/0049941, "Programmable Circuit Having Multiple Sectors," which is incorporated by reference in its entirety for all purposes. The FPGA 40 may be formed on a single plane. Additionally or alternatively, the FPGA 40 may be a three-dimensional FPGA having a base die and a fabric die of the type described in U.S. Pat. No. 10,833,679, "Multi-purpose Interface for Configuration Data and User Fabric Data," which is incorporated by reference in its entirety for all purposes.

In the example of FIG. 2, the FPGA 40 may include transceiver 42 that may include and/or use input-output circuitry for driving signals off the FPGA 40 and for receiving signals from other devices. Interconnection resources 44 may be used to route signals, such as clock or data signals, through the FPGA 40. The FPGA 40 of FIG. 2 is sectorized, meaning that programmable logic resources may be distributed through a number of discrete programmable logic sectors 46. Each programmable logic sector 46 may include a number of programmable logic elements 48 having operations defined by configuration memory 50 (e.g., configuration random access memory (CRAM)). The programmable logic elements 48 may include combinational or sequential logic circuitry. For example, the programmable logic elements 48 may include look-up tables, registers, multiplexers, routing wires, and so forth. A designer may program the programmable logic elements 48 to perform a variety of desired functions. A power supply 52 may provide a source of voltage and current to a power distribution network (PDN) 54 that distributes electrical power to the various components of the FPGA 40. Operating the circuitry of the FPGA 40 causes power to be drawn from the power distribution network 54.

There may be any suitable number of programmable logic sectors 46 on the FPGA 40. Indeed, while 29 programmable logic sectors 46 are shown here, it should be appreciated that more or fewer may appear in an actual implementation (e.g., in some cases, on the order of 50, 100, 500, 1000, 5000, 10,000, 50,000, or 100,000 sectors or more). Each programmable logic sector 46 may include a sector controller (SC) 56 that controls the operation of the programmable logic sector 46. Each sector controller 56 may be in communication with a device controller (DC) 58. Each sector controller 56 may accept commands and data from the device controller 58 and may read data from and write data into its configuration memory 50 based on control signals from the device controller 58. In addition to these operations, the sector controller 56 may be augmented with numerous additional capabilities. For example, such capabilities may include locally sequencing reads and writes to implement error detection and correction on the configuration memory 50 and sequencing test control signals to effect various test modes.

The sector controllers 56 and the device controller 58 may be implemented as state machines and/or processors. For example, each operation of the sector controllers 56 or the device controller 58 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 46. This may provide usable extensibility in an efficient and easily understood way. This may be useful because new commands could bring about large amounts of local activity within the sector at the expense of only a small amount of communication between the device controller 58 and the sector controllers 56.

Each sector controller 56 thus may communicate with the device controller 58, which may coordinate the operations of the sector controllers 56 and convey commands initiated from outside the FPGA device 40. To support this communication, the interconnection resources 44 may act as a network between the device controller 58 and each sector controller 56. The interconnection resources may support a wide variety of signals between the device controller 58 and each sector controller 56. In one example, these signals may be transmitted as communication packets.

The FPGA 40 may be electrically programmed. With electrical programming arrangements, the programmable elements 48 may include one or more logic elements (wires, gates, registers, etc.). For example, during programming, configuration data is loaded into the configuration memory 50 using pins and input/output circuitry. In one example, the configuration memory 50 may be implemented as configuration random-access-memory (CRAM) cells. As discussed below, in some embodiments, the configuration data may be loaded into the FPGA 40 using an update to microcode of the processor in which the FPGA 40 is embedded. The use of configuration memory 50 based on RAM technology is described herein is intended to be only one example. Moreover, configuration memory 50 may be distributed (e.g., as RAM cells) throughout the various programmable logic sectors 46 the FPGA 40. The configuration memory 50 may provide a corresponding static control output signal that controls the state of an associated programmable logic element 48 or programmable component of the interconnection resources 44. The output signals of the configuration memory 50 may be applied to the gates of metal-oxide-semiconductor (MOS) transistors that control the states of the programmable logic elements 48 or programmable components of the interconnection resources 44.

The sector controllers 56 and/or the device controller 58 may determine when each sector controller 56 performs a CRAM read operation on the configuration memory 50 of its programmable logic sector 46. Each time the sector controller 56 performs a CRAM read of the configuration memory 50, power is drawn from the power distribution network 54. If too much power is drawn from the power distribution network 54 at any one time, the voltage provided by the power distribution network 54 could drop to an unacceptably low level, or too much noise could arise on the power distribution network 54. To avoid this, the device controller 58 and/or the sector controllers 56 may structure CRAM reads of the programmable logic sectors 46 to avoid excessive instantaneous power consumption by temporally and/or spatially distributing the CRAM reads across different programmable logic sectors 46.

The sector controller 56 of the programmable logic sector 46 is shown to read and write to the configuration memory 50 by providing an ADDRESS signal to an address register and providing a memory write signal (WRITE), a memory read signal (RD DATA), and/or the data to be written (WR DATA) to a data register. These signals may be used to cause the data register to write data to or read data from a line of configuration memory 50 that has been activated along an address line, as provided by the ADDRESS signal applied to the address register. Memory read/write circuitry may be used to write data into the activated configuration memory 50 cells when the data register is writing data and may be used to sense and read data from the activated configuration memory 50 cells when the data register is reading data.

Figure 3:
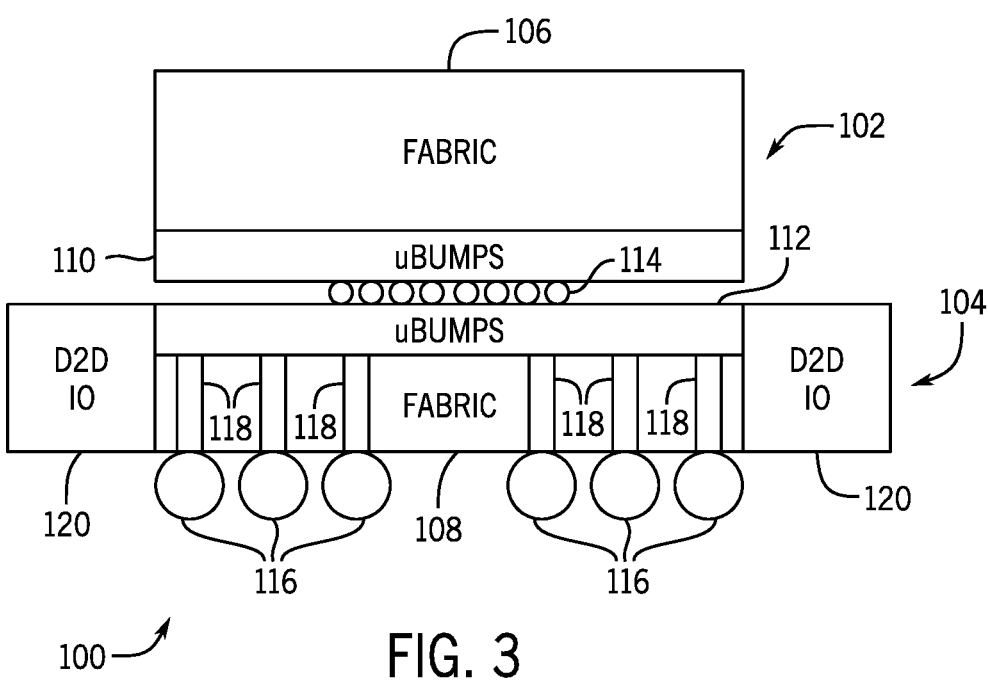
FIG. 3 is a diagram of a heterogenous package including heterogenous integrated circuits including the programmable fabric of FIG. 2, in accordance with an embodiment.

The integrated circuit 12 may be combined into a packaged device. For instance, multiple programmable fabric die may be combined into a single package. For example, as illustrated in FIG. 3, a heterogenous system 100 may integrate a top programmable fabric die 102 and a base programmable fabric die 102. As illustrated, the top programmable fabric die 102 and the base programmable fabric die 104 share some similarities, but they also have some differences in form. The top programmable fabric die 102 is arranged above a base programmable fabric die 104 in the system. The top programmable fabric die 102 includes a programmable fabric 106. Likewise, the base programmable fabric die 104 includes a programmable fabric 108. The top programmable fabric die 102 includes a microbump interface 110, and the base programmable fabric die 104 includes a microbump interface 112 to interface with the microbump interface 110 using multiple microbumps 114.

As illustrated, the base programmable fabric die 104 (but not the top programmable fabric die 102) is coupled to multiple solder balls 116 that couple to another device (e.g., a substrate or printed circuit board). The solder balls 116 couple to through silicon vias (TSVs) 118 to provide connectivity between the other device and various layers of the base programmable fabric die 104 and/or the top programmable fabric die 104. The base programmable fabric die 104 also includes die-to-die input-output circuitry 120 (e.g., the transceiver 42) that may be used to drive signals off the FPGA 40 and to receive signals from other devices.

Although the heterogenous system 100 provides the programmable fabrics 106 and 108 in a compact package, the top programmable fabric die 102 and the base programmable fabric die 104 have different designs even if the contents of the programmable fabrics 106 and 108 are the same. These different designs result in higher research and development costs than may be used for a single die design. Additionally or alternatively, these different designs may result in higher manufacturing costs than a single die design. Furthermore, the programmable fabrics 106 and 108 may have different capacities/densities/properties due to the base programmable fabric die 104 having the TSVs 118 while the top programmable fabric die 102 does not. If the top and base die of a programmable logic package have a common design, the overall package may provide a high-capacity programmable logic device with more efficient research, development, and manufacturing costs.

Figure 4:
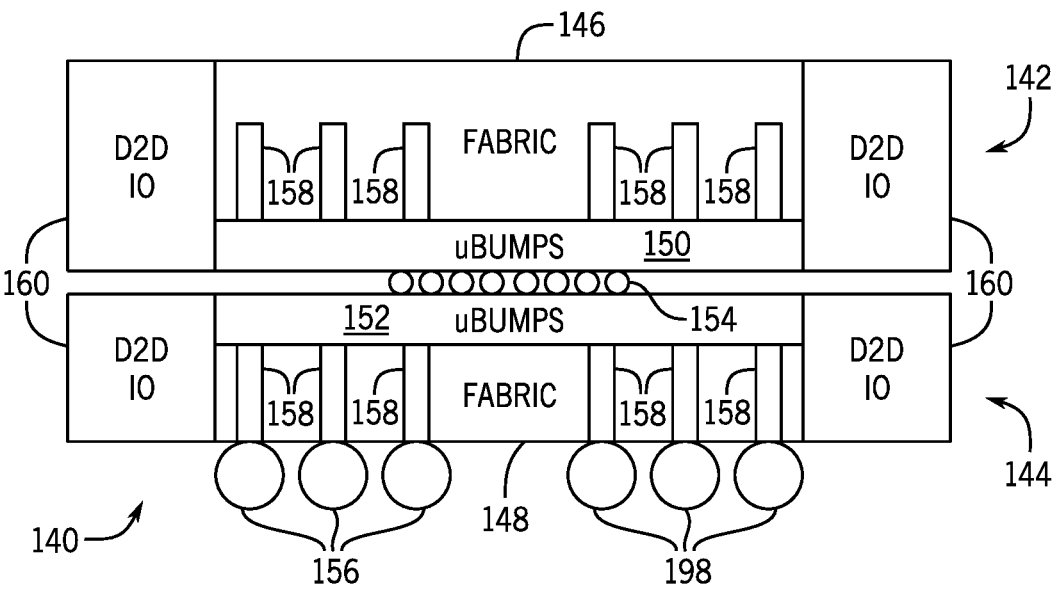
FIG. 4 is a diagram of a homogenous package including homogenous integrated circuits including the programmable fabric of FIG. 2, in accordance with an embodiment.

FIG. 4 is a diagram of a homogenous system 140 with a top programmable fabric die 142 (e.g., a flip-chip) and a base programmable fabric die 144 that have a same design, form, and node process. By the top programmable fabric die 142 and the base programmable fabric die 144 having the same design, correct connectivity between the top programmable fabric die 142 and the base programmable fabric die 144 may be ensured using symmetry constraints for signaling, TSVs, and/or for power microbumps.

Returning to FIG. 4, the top programmable fabric die 142 and the base programmable fabric die 144 includes respective programmable fabrics 146 and 148. Additionally, the top programmable fabric die 142 includes a microbump interface 150, and the base programmable fabric die 144 includes a microbump interface 152 that interfaces with the microbump interface 150 using microbumps 154. As previously noted, the power microbumps may be aligned due to a symmetrical arrangement in the top programmable fabric die 142 and the base programmable fabric die 144. The base programmable fabric die 144 couples directly to solder balls 156, but the top programmable fabric die 146 does not couple to solder balls. However, even though the top programmable fabric die 142 does not couple directly to any solder balls, the top programmable fabric die 142 and the base programmable fabric die 144 both include TSVs 158. In fact, the TSVs 158 of the top programmable fabric die 142 may be covered as they are unrevealed or exposed on any side of the top programmable fabric die, but the top programmable fabric die 142 and the base programmable fabric die 144 may still come from the same die pool with a common design. Furthermore, the presence of the TSVs 158 in the top programmable fabric die 142 ensures the same density in the programmable fabrics 146 and 148. Furthermore, the presence of the TSVs 158 in the top programmable fabric die 142, along with their symmetry, help ensure alignment between the top programmable fabric die 142 and the base programmable fabric die 144 when the top programmable fabric die 142 and the base programmable fabric die 144 are arranged in a three-dimensional configuration. Also, as illustrated, the top programmable fabric die 142 and the base programmable fabric die 144 include die-to-die input-output circuitry 160 to drive data off the respective fabric die and/or receive data from the respective fabric die. This arrangement simplifies manufacturing of the top programmable fabric die 142 and the base programmable fabric die 144 even if the die-to-die input-output circuitry 160 of the top programmable fabric die 142 is unused to connect to other die.

Figure 5:
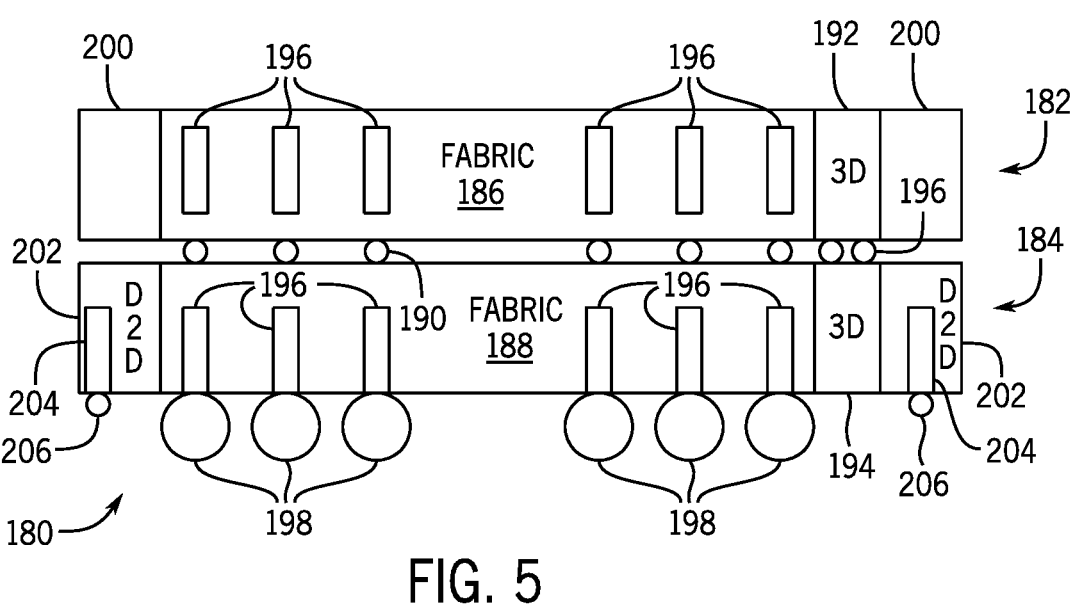
FIG. 5 is a diagram of a homogenous package including homogenous integrated circuits including the programmable fabric of FIG. 2, in accordance with an alternative embodiment.

FIG. 5 is a diagram of a homogenous system 180 with a top programmable fabric die 182 and a base programmable fabric die. The top programmable fabric die 182 and the base programmable fabric die 184 include respective programmable fabrics 186 and 188. The top programmable fabric die 182 and the base programmable fabric die 184 utilize microbumps 190 to interface between respective regions/sectors of the top programmable fabric die 182 and the base programmable fabric die 184. The top programmable fabric die 182 and the base programmable fabric die 184 also include perimeter three-dimensional interfaces 192 and 194 that may be used to provide connectivity between the top programmable fabric die 182 and the base programmable fabric die 184.

The top programmable fabric die 182 and the base programmable fabric die 184 also include TSVs 196 even though only the base programmable fabric die 184 couples to solder balls 198. The top programmable fabric die 182 includes die-to-die input-output circuitry 200, and the base programmable fabric die 184 includes die-to-die input-output circuitry 202. The die-to-die input-output circuitry 202 includes a TSV 204 to provide a through connection from a bump 206 (e.g., microbump) within the die-to-die input-output circuitry 202 and/or to the die-to-die input-output circuitry 200. Furthermore, although the illustrated die-to-die input-output circuitry 200 does not include a TSV, in some embodiments, the die-to-die input-output circuitry 202 may include a TSV like the TSV 204. However, in certain embodiments, the TSV in the die-to-die input-output circuitry 200 may be unused and/or unexposed/unrevealed.

Figure 6:
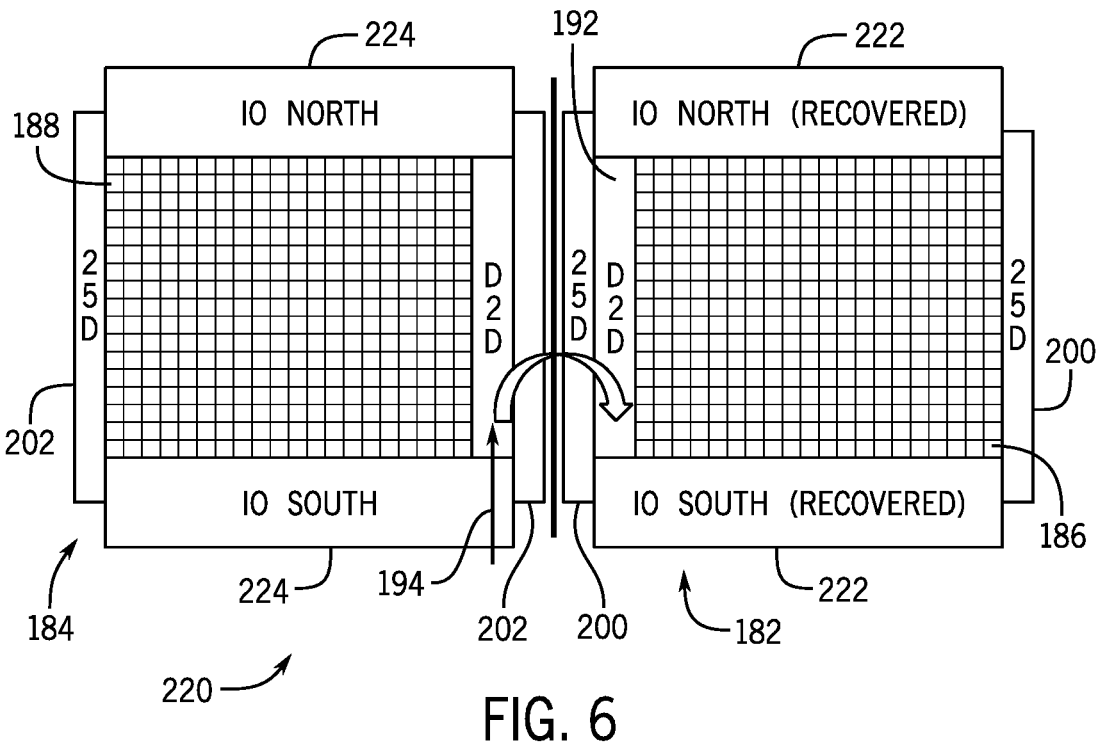
FIG. 6 is diagram showing a perimeter connectivity for a homogenous package having homogenous integrated circuits, in accordance with an embodiment.

Although the perimeter three-dimensional interface 194 is at a right side of the right side of the base programmable fabric die 184 and the perimeter three-dimensional interface 192 is located at the right side of the flipped top programmable fabric die 182, the top programmable fabric die 182 and the base programmable fabric die 184 may have the same design due to symmetry in the top programmable fabric die 182 and the base programmable fabric die 184. FIG. 6 is a schematic diagram of a view 220 of the homogenous system 180 of FIG. 5 with the top programmable fabric die 182 flipped so that the interfaces between the top programmable fabric die 182 and the base programmable fabric die 184 are exposed. The top programmable fabric die 182 and the base programmable fabric die 184 may have the same design. The locations of the perimeter three-dimensional interface may be attributable to a rotation (e.g., 180 rotation) of the top programmable fabric die 182.

The top programmable fabric die 182 has input-output circuitry 222, and the base programmable fabric die 184 has input-output circuitry 224. The input-output circuitry 222 may be unconnected to external die via a bump 206. Instead, due to the rotation of the top programmable fabric die 182 and/or due to the die-to-die input-output circuitry 200 not being directly coupled to a respective bump, the inputs/outputs of the input-output circuitry 222 may be performed (e.g., recovered) using the input-output circuitry 224.

Figure 7:
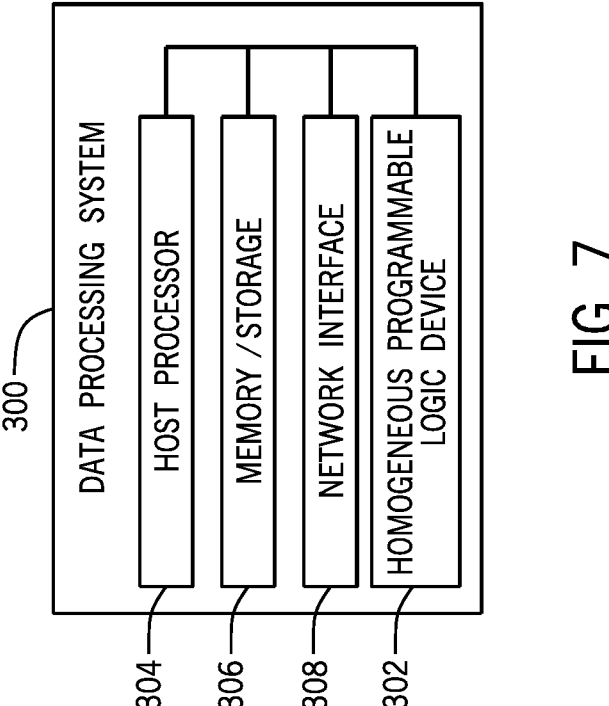
FIG. 7 is a block diagram of a data processing system including a processor with an integrated programmable fabric unit, in accordance with an embodiment.

Bearing the foregoing in mind, a processor and two or more programmable fabric die in a homogenous arrangement may be integrated into a data processing system or may be a component included in a data processing system, such as a data processing system 300, shown in FIG. 7. The data processing system 300 may include a host processor 304 (e.g., the processor 130), memory and/or storage circuitry 306, and a network interface 308. The data processing system 300 may include more or fewer components (e.g., electronic display, user interface structures, application specific integrated circuits (ASICs)). The host processor 304 may include any of the foregoing processors that may manage a data processing request for the data processing system 300 (e.g., to perform encryption, decryption, machine learning, video processing, voice recognition, image recognition, data compression, database search ranking, bioinformatics, network security pattern identification, spatial navigation, cryptocurrency operations, or the like). The memory and/or storage circuitry 306 may include random access memory (RAM), read-only memory (ROM), one or more hard drives, flash memory, or the like. The memory and/or storage circuitry 306 may hold data to be processed by the data processing system 300. In some cases, the memory and/or storage circuitry 306 may also store configuration programs (bitstreams) for programming the homogeneous programmable logic device 302. The network interface 308 may allow the data processing system 300 to communicate with other electronic devices. The data processing system 300 may include several different packages or may be contained within a single package on a single package substrate. For example, components of the data processing system 300 may be located on several different packages at one location (e.g., a data center) or multiple locations. For instance, components of the data processing system 300 may be located in separate geographic locations or areas, such as cities, states, or countries.

In one example, the data processing system 300 may be part of a data center that processes a variety of different requests. For instance, the data processing system 300 may receive a data processing request via the network interface 308 to perform encryption, decryption, machine learning, video processing, voice recognition, image recognition, data compression, database search ranking, bioinformatics, network security pattern identification, spatial navigation, digital signal processing, or some other specialized task.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

Example Embodiments

EXAMPLE EMBODIMENT 1. An integrated circuit device comprising:

a plurality of microbumps;

a top programmable fabric die comprising a first programmable fabric and a first microbump interface coupled to the plurality of microbumps; and a base programmable fabric die comprising a second programmable fabric and a second microbump interface coupled to the first microbump interface via a coupling to the plurality of microbumps, wherein the top programmable fabric die and the base programmable fabric die have a same design, and the top programmable fabric die and the base programmable fabric die are arranged in a three-dimensional die arrangement with the top programmable fabric die flipped above the base programmable fabric die.

EXAMPLE EMBODIMENT 2. The integrated circuit device of example embodiment 1, wherein the top programmable fabric die and the bottom programmable fabric die comprise through silicon vias.

EXAMPLE EMBODIMENT 3. The integrated circuit device of example embodiment 2, wherein the through silicon vias of the top programmable fabric die are not exposed to any surface of the top programmable fabric die.

EXAMPLE EMBODIMENT 4. The integrated circuit device of example embodiment 1, wherein the top programmable fabric die comprises first input-output circuitry, and the base programmable fabric die comprises second input-output circuitry.

EXAMPLE EMBODIMENT 5. The integrated circuit device of example embodiment 4, wherein the second input-output circuitry comprises a through silicon via electrically connected to the first input-output circuitry.

EXAMPLE EMBODIMENT 6. The integrated circuit device of example embodiment 4, wherein the second input-output circuitry comprises a through silicon via that is not exposed to the first input-output circuitry.

EXAMPLE EMBODIMENT 7. The integrated circuit device of example embodiment 4, wherein the second input-output circuitry is operable to be connected to another electronic device, and the first input-output circuitry is not operable to be connected to another electronic device.

EXAMPLE EMBODIMENT 8. The integrated circuit device of example embodiment 7, wherein inputs-output channels of the first input-output circuitry are recovered to be received via the second input-output circuitry.

EXAMPLE EMBODIMENT 9. The integrated circuit device of example embodiment 1, wherein the top programmable fabric die comprises a first perimeter three-dimensional interface located at a perimeter of the top programmable fabric die, and the base programmable fabric die comprises a second perimeter three-dimensional interface at a perimeter of the based programmable fabric die and is operable to interface with the first perimeter three-dimensional interface.

EXAMPLE EMBODIMENT 10. The integrated circuit device of example embodiment 9, wherein the first perimeter three-dimensional interface is coupled to the second perimeter three-dimensional interface via one or more microbumps.

EXAMPLE EMBODIMENT 11. An integrated circuit device comprising:

a semiconductor device;

a plurality of microbumps;

a top programmable fabric die comprising a first programmable fabric, a first through silicon via coupled to the semiconductor device, and a first microbump interface coupled to the plurality of microbump, wherein the semiconductor device is coupled to the top programmable fabric die; and a base programmable fabric die comprising a second programmable fabric, a second through silicon via that is not exposed on any side of the base programmable fabric die, and a second microbump interface coupled to the first microbump interface via a coupling to the plurality of microbumps.

EXAMPLE EMBODIMENT 12. The integrated circuit device of example embodiment 11, wherein the first through silicon via is coupled to the semiconductor device via a solder ball.

EXAMPLE EMBODIMENT 13. The integrated circuit device of example embodiment 11, wherein the semiconductor device comprises a printed circuit board or substrate.

EXAMPLE EMBODIMENT 14. The integrated circuit device of example embodiment 11, wherein the top programmable fabric die and the base programmable fabric die have a same design.

EXAMPLE EMBODIMENT 15. The integrated circuit device of example embodiment 11, the top programmable fabric die and the base programmable fabric die are arranged in a flip-chip package.

EXAMPLE EMBODIMENT 16. The integrated circuit device of example embodiment 11, wherein the base programmable fabric die comprises an input-output interface that is coupled to one or more other electronic devices.

EXAMPLE EMBODIMENT 17. The integrated circuit device of example embodiment 11, wherein the top programmable fabric die comprises an input-output interface that is not coupled to any external devices.

EXAMPLE EMBODIMENT 18. A method of manufacturing a programmable logic device, comprising:

forming a first programmable logic die having a first plurality of through silicon vias using a process;

forming a second programmable logic die having a second plurality of through silicon vias using the process; and mounting the first programmable logic die and the second programmable logic die together in a flip-chip package by flipping the first programmable logic die using microbumps.

EXAMPLE EMBODIMENT 19. The method of manufacturing of example embodiment 18, comprising exposing the second plurality of through silicon vias without exposing the first plurality of through silicon vias.

EXAMPLE EMBODIMENT 20. The method of manufacturing of example embodiment 19, comprising coupling the second plurality of through silicon vias to a substrate or other semiconductor device via solder balls.

What is claimed is:

1. An integrated circuit device comprising:

a plurality of microbumps;

a top programmable fabric die comprising a first programmable fabric and a first microbump interface coupled to the plurality of microbumps; and a base programmable fabric die comprising a second programmable fabric and a second microbump interface coupled to the first microbump interface via a coupling to the plurality of microbumps, wherein the top programmable fabric die and the base programmable fabric die have a same design, and the top programmable fabric die and the base programmable fabric die are arranged in a three-dimensional die arrangement in different planes with the top programmable fabric die flipped above the base programmable fabric die, wherein the top programmable fabric die and the base programmable fabric die comprise through silicon vias that are not exposed to a surface of the top programmable fabric die.

2. The integrated circuit device of claim 1, wherein the top programmable fabric die comprises first input-output circuitry, and the base programmable fabric die comprises second input-output circuitry.

3. The integrated circuit device of claim 2, wherein the second input-output circuitry comprises a through silicon via electrically connected to the first input-output circuitry.

4. The integrated circuit device of claim 2, wherein the second input-output circuitry comprises a through silicon via that is not exposed to the first input-output circuitry.

5. The integrated circuit device of claim 2, wherein the second input-output circuitry is operable to be connected to another electronic device, and the first input-output circuitry is not operable to be connected to another electronic device.

6. The integrated circuit device of claim 5, wherein input-output channels of the first input-output circuitry are recovered by using the second input-output circuitry.

7. The integrated circuit device of claim 1, wherein the top programmable fabric die comprises a first perimeter interface located at a perimeter of the top programmable fabric die, and the base programmable fabric die comprises a second perimeter interface at a perimeter of the based programmable fabric die and is operable to interface with the first perimeter three-dimensional interface.

8. The integrated circuit device of claim 7, wherein the first perimeter three-dimensional interface is coupled to the second perimeter three-dimensional interface via one or more microbumps.

9. The integrated circuit device of claim 1, wherein the through silicon vias were first exposed to the surface and then covered.

10. An integrated circuit device comprising:

a semiconductor device;

a plurality of microbumps;

a top programmable fabric die comprising a first programmable fabric, a first through silicon via coupled to the semiconductor device, and a first microbump interface coupled to the plurality of microbumps, wherein the semiconductor device is coupled to the top programmable fabric die; and a base programmable fabric die comprising a second programmable fabric, a second through silicon via that is not exposed on any side of the base programmable fabric die, and a second microbump interface coupled to the first microbump interface via a coupling to the plurality of microbumps.

11. The integrated circuit device of claim 10, wherein the first through silicon via is coupled to the semiconductor device via a solder ball.

12. The integrated circuit device of claim 10, wherein the semiconductor device comprises a printed circuit board or substrate.

13. The integrated circuit device of claim 10, wherein the top programmable fabric die and the base programmable fabric die have a same design.

14. The integrated circuit device of claim 10, the top programmable fabric die and the base programmable fabric die are arranged in a flip-chip package.

15. The integrated circuit device of claim 10, wherein the base programmable fabric die comprises an input-output interface that is coupled to one or more other electronic devices.

16. The integrated circuit device of claim 10, wherein the top programmable fabric die comprises an input-output interface that is not coupled to any external devices.

17. A method of manufacturing a programmable logic device, comprising:

forming a first programmable logic die having a first plurality of through silicon vias using a process;

forming a second programmable logic die having a second plurality of through silicon vias using the process; and mounting the first programmable logic die and the second programmable logic die together in a flip-chip package by flipping the first programmable logic die and by using microbumps to interconnect the first programmable logic die and the second programmable logic die.

18. The method of manufacturing of claim 17, comprising exposing the second plurality of through silicon vias without exposing the first plurality of through silicon vias.

19. The method of manufacturing of claim 18, comprising coupling the second plurality of through silicon vias to a substrate or other semiconductor device via solder balls.

* * * * *